(12) United States Patent
Umemoto et al.

(10) Patent No.: US 6,875,526 B2
(45) Date of Patent: Apr. 5, 2005

(54) COMPOSITE DEVICES OF LAMINATE TYPE AND PROCESSES FOR PRODUCING SAME

(75) Inventors: Takashi Umemoto, Hirakata (JP); Hideki Yoshikawa, Takarazuka (JP); Hitoshi Hirano, Nishinomiya (JP)

(73) Assignee: Sanyo Electric Co., Ltd, Osaka (JP)

( * ) Notice: Subject to any disclaimer, the term of this patent is extended or adjusted under 35 U.S.C. 154(b) by 0 days.

(21) Appl. No.: 10/071,131

(22) Filed: Feb. 11, 2002

(65) Prior Publication Data

US 2002/0118519 A1 Aug. 29, 2002

(30) Foreign Application Priority Data

| Feb. 14, 2001 | (JP) | ........................................ | 2001-037541 |
| Feb. 14, 2001 | (JP) | ........................................ | 2001-037542 |
| Feb. 14, 2001 | (JP) | ........................................ | 2001-037543 |

(51) Int. Cl.[7] ............................................... B32B 9/00
(52) U.S. Cl. ........................ 428/692; 428/210; 428/212; 428/694 GR; 174/258
(58) Field of Search ................................ 428/212, 692, 428/694, 210, 209

(56) References Cited

U.S. PATENT DOCUMENTS

| 5,294,477 | A | * | 3/1994 | Kanba et al. ................ 428/212 |
| 5,455,000 | A | * | 10/1995 | Seyferth et al. ............... 419/36 |
| 5,476,728 | A | * | 12/1995 | Nakano et al. ............. 428/692 |
| 6,248,290 | B1 | * | 6/2001 | Kuwabara ....................... 419/6 |
| 6,337,123 | B1 | * | 1/2002 | Ryugo et al. ................ 428/210 |
| 6,426,551 | B1 | * | 7/2002 | Kawakami et al. ......... 257/700 |

* cited by examiner

*Primary Examiner*—Cathy Lam
(74) *Attorney, Agent, or Firm*—Westerman, Hattori, Daniels & Adrian LLP

(57) ABSTRACT

In a composite device having a laminate structure of a magnetic body ceramic layer 1 and a dielectric ceramic layer 2, an intermediate layer 3 is interposed between the ceramic layers 1 and 2. The intermediate layer 3 varies in composition in the direction of thickness thereof and exhibits substantially the same shrinkage as the magnetic body ceramic layer 1 at a joint thereof with this layer 1 when fired and substantially the same shrinkage as the dielectric ceramic layer 2 at a joint thereof with the layer 2 when fired, whereby the ceramic layers can be prevented from cracking or separating during firing.

13 Claims, 16 Drawing Sheets

COMPOSITE DEVICES OF LAMINATE TYPE AND PROCESSES FOR PRODUCING SAME

FIELD OF THE INVENTION

The present invention relates to composite devices of the laminate type for providing various electronic circuits for use in electronic devices such as portable telephones and to processes for producing such composite devices.

BACKGROUND OF THE INVENTION

In recent years it has been required with ever increasing severity that compact electronic devices such as portable telephones be reduced in size. In such a situation, it has been practice to incorporate circuit elements for constituting a device into a composite laminate device and to mount the composite device on a main board.

As shown in FIGS. 16 and 17, the composite device of the laminate type has a laminate structure comprising a plurality of ceramic layers 1, 2 each of which is provided on the surface thereof with a plurality of circuit element patterns 11 or 21 for constituting an inductor or capacitor. Such circuit element patterns 11, 21 are connected to one another through conductor patterns 13, 23 formed on the ceramic layers 1, 2 or conduction channels (via holes) 12, 22 extending through the ceramic layers 1, 2 to provide an electronic circuit such as a filter.

With such composite devices, it has been proposed to form a pattern (hereinafter referred to as an "L-pattern") for providing an inductance on the magnetic body ceramic layer 1 so as to increase the inductance of the L-pattern and to form a pattern (hereafter referred to as a "C-pattern") for constituting a capacitor on the dielectric ceramic layer 2 in order to increase the capacitance of the C-pattern [JP-A No. 60-106114(1985), JP-A No. 6-333743(1994), etc.].

Composite devices of the type mentioned are fabricated generally in the following manner. A required number of magnetic body boards prepared by forming an L-pattern on the surface of each of magnetic body green sheets are laminated to obtain an inductor laminate, and a required number of dielectric boards prepared by forming a C-pattern on the surface of each of dielectric green sheets are laminated to obtain a capacitor laminate. The two laminates as lapped over each other are fired to join the boards and obtain a sintered laminate. A plurality of electronic components are mounted on the surface of the sintered laminate as required to complete a composite device of the laminate type in the form of a single chip.

However, the conventional composite device of the laminate type has the following problem. In firing the combined laminate obtained by laminating the magnetic body boards comprising magnetic body green sheets and the dielectric boards comprising dielectric green sheets, the magnetic body ceramic layer 1 and the dielectric ceramic layer 2 are curved and greatly deflected by the firing step as shown in FIG. 18 because the magnetic body green sheet and the dielectric green sheet differ greatly in shrinkage, possibly creating a crack K in the resulting laminate.

FIG. 19(a) shows the portion A in FIG. 18 on an enlarged scale before firing, and FIG. 19(b) shows the portion A of FIG. 18 on an enlarged scale after firing. At the joint between the ceramic layers 1, 2 lapping over each other as seen in FIG. 19(a), the circuit element patterns 11, 21 and the via holes 12, 22 corresponding thereto are positioned in match before firing, whereas the circuit element patterns 11, 21 are positioned as shifted or separated from the corresponding via holes 12, 22 after firing as shown in FIG. 19(b), hence the problem of a reduced yield.

Accordingly, another composite device of the laminate type has been proposed which comprises a magnetic body ceramic layer, a dielectric ceramic layer, and a material mixture layer formed between the two ceramic layers and containing a mixture of substantially the same magnetic material as the magnetic body ceramic layer and substantially the same dielectric material as the dielectric ceramic layer so as to prevent separation at the joint interface between the ceramic layers [JP-A No. 6-325979(1994)].

With the proposed composite device, the material mixture layer is intermediate between the magnetic body ceramic layer and the dielectric ceramic layer in shrinkage, such that the difference in shrinkage between the material mixture layer and each ceramic layer is diminished to one half the shrinkage difference between the ceramic layers, whereas there still exists a great shrinkage difference between the component layers of the proposed device. Thus, the problem of cracking or separation has yet to be overcome.

SUMMARY OF THE INVENTION

An object of the present invention is to overcome the problem of cracking and separation occurring in the firing step and to provide the structure of a composite laminate device which is available in an improved yield and a process for producing the device.

The present invention provides a first composite device of the laminate type having a laminate structure of a first ceramic layer and a second ceramic layer different from each other in composition, each of the ceramic layers having one or a plurality of circuit element patterns formed on a surface thereof, a plurality of circuit element patterns, which are formed on a plurality of ceramic layers, connected each other to provide an electronic circuit for performing a predetermined function, an intermediate layer being interposed between the first ceramic layer and the second ceramic layer, the intermediate layer varying in composition in the direction of thickness thereof and exhibiting substantially the same shrinkage as the first ceramic layer at a joint thereof with the first ceramic layer when fired and substantially the same shrinkage as the second ceramic layer at a joint thereof with the second ceramic layer when fired. When required, the intermediate layer is provided with conductor patterns or conduction channels (via holes) for effecting electrical conduction between the first and second ceramic layers on opposite sides thereof.

With the first composite device of the invention, the intermediate layer varies in composition in the direction of thickness thereof and therefore varies also in shrinkage in the direction of thickness thereof when fired. The intermediate layer is equivalent to the first ceramic layer in shrinkage at the joint thereof with this layer, so that little or no difference occurs in shrinkage at the joint between the intermediate layer and the first ceramic layer. The intermediate layer is also equivalent to the second ceramic layer in shrinkage at the joint between the intermediate layer and this layer, so that little or no difference occurs in shrinkage at this joint. In the firing step, therefore, the laminate of the first and second ceramic layers is unlikely to deflect as curved greatly. This obviates the likelihood of the ceramic layers cracking or separating.

Stated specifically, the intermediate layer contains at least one of elements constituting the first ceramic layer and at least one of elements constituting the second ceramic layer, the intermediate layer containing a greater amount of said one element of the first ceramic layer than said one element of the second ceramic layer in the vicinity of the joint thereof with the first ceramic layer and a greater amount of said one element of the second ceramic layer than said one element of the first ceramic layer in the vicinity of the joint thereof with the second ceramic layer. At each of the joints between the intermediate layer and the ceramic layers, the respective crystal lattices then conform to each other satisfactorily, preventing separation more reliably at the joint interface.

Further stated specifically, the intermediate layer has the same composition as the first ceramic layer in the vicinity of the joint thereof with the first ceramic layer and the same composition as the second ceramic layer in the vicinity of the joint thereof with the second ceramic layer. At the joint between each ceramic layer and the intermediate layer, the crystal lattices then conform to each other more satisfactorily, and the two layers exhibit the same shrinkage at the joint, whereby the separation of the layers can be prevented more reliably at the joint interface.

Further stated specifically, the intermediate layer is made from a material having a specific resistance of at least $10^4$ $\Omega$-cm. This precludes increases in loss in the high frequency range of the device.

For example, the first ceramic layer is a magnetic body, and the second ceramic layer is a dielectric. In this case, an inductor pattern (L-pattern) is formed on the surface of the first ceramic layer, and a capacitor pattern (C-pattern) on the surface of the second ceramic layer. Each ceramic layer is made from a material suited to the characteristic value to be exhibited by the pattern thereof, so that even if the pattern has the same size as in the prior art, the pattern exhibits a more excellent characteristic value than conventionally. This serves to diminish the pattern size to render the composite device of the laminate type compact.

The present invention provides a process for producing the first composite device of the laminate type which has the steps of:

preparing a first green sheet having one or a plurality of circuit element patterns formed on a surface thereof, a second green sheet having one or a plurality of circuit element patterns formed on a surface thereof, and an intermediate green sheet varying in composition in the direction of thickness thereof and exhibiting at one surface thereof substantially the same shrinkage as the first green sheet when fired and at the other surface thereof substantially the same shrinkage as the second green sheet when fired, preparing a laminate comprising a plurality of layers by sandwiching the intermediate green sheet between the first green sheet and the second green sheet, with said one surface facing the first green sheet and with said other surface facing the second green sheet, and firing the laminate.

The process described above for producing the first composite device provides the first ceramic layer by the first green sheet, the second ceramic layer by the second green sheet and the intermediate layer by the intermediate green sheet to provide the composite device. The firing step produces no shrinkage difference at the joint interfaces between the intermediate green sheet and the two green sheets, therefore obviating the likelihood of curving the laminate by firing and thus preventing the ceramic layers from cracking or separating from each other.

Stated more specifically, the intermediate green sheet is prepared in the sheet preparing step by lapping a first green sheet and a second green sheet over each other and firing the two sheets in this state at a low temperature. This step causes particles of each green sheet to diffuse into the other green sheet at the joint interface between the first green sheet and the second green sheet, with the result that the intermediate sheet obtained has substantially the same shrinkage as the first green sheet at one surface thereof and substantially the same shrinkage as the second green sheet at the other surface thereof.

Alternatively, the intermediate green sheet is prepared in the sheet preparing step by forming into a strip a first slurry for making the first green sheet and forming into a strip a second slurry for making the second green sheet while lapping the strips over each other in layers. This step causes particles of each slurry to diffuse into the other slurry at the joint interface between the first slurry and the second slurry, with the result that the intermediate sheet obtained has substantially the same shrinkage as the first green sheet at one surface thereof and substantially the same shrinkage as the second green sheet at the other surface thereof. If the layers of the two slurries are heated, the diffusion can be promoted.

The present invention provides a second composite device of the laminate type having a laminate structure of a first ceramic layer and a second ceramic layer different from each other in composition, at least one of the first ceramic layer and the second ceramic layer as arranged in contact with each other varying in composition in the direction of thickness thereof and exhibiting substantially the same shrinkage as the other ceramic layer at a joint thereof with the other ceramic layer when fired.

With the second composite device of the invention, one of the ceramic layers varies in composition in the direction of thickness thereof and therefore varies also in shrinkage in the same direction when fired. The above-mentioned one ceramic layer is equivalent in shrinkage to the other ceramic layer at the joint between the two ceramic layers, and accordingly the joint involves little or no difference in shrinkage. Accordingly, the firing step is unlikely to deflect the laminate of first and second ceramic layers greatly by curving. This obviates the likelihood that the ceramic layers will crack or separate from each other.

Stated more specifically, the above-mentioned one ceramic layer contains at least one of elements constituting the other ceramic layer and increases in the content of said one element toward the joint thereof with the other ceramic layer. At the joint between the ceramic layers, the respective crystal lattices then conform to each other satisfactorily, preventing separation more reliably at the joint interface.

Further stated more specifically, the above-mentioned one ceramic layer has the same composition as the other ceramic layer in the vicinity of the joint between the two ceramic layers. At the joint between the ceramic layers, the crystal lattices then conform to each other more satisfactorily, and the two layers exhibit the same shrinkage at the joint, whereby the separation of the layers can be prevented more reliably at the joint interface.

Further stated more specifically, the first ceramic layer is a dielectric, and the second ceramic layer is a magnetic body. A C-pattern is then formed on the surface of the first ceramic layer, and an L-pattern on the surface of the second ceramic layer. Each ceramic layer is made from a material suited to the characteristic value to be exhibited by the pattern thereof, so that even if the pattern has the same size as in the prior art, the pattern exhibits a more excellent characteristic value than conventionally. This serves to diminish the pattern size to render the composite device of the laminate type compact.

Further stated more specifically, each of the first ceramic layer and the second ceramic layer as arranged in contact with each other varies in composition in the direction of thickness thereof, and the two ceramic layers exhibit substantially the same shrinkage in the vicinity of the joint thereof when fired. The two ceramic layers are thus equivalent in shrinkage at the joint, which therefore involves little or no difference in shrinkage.

The present invention provides a process for producing the second composite device of the laminate type having the steps of:

preparing first green sheets for making first ceramic layers and second green sheets for making second ceramic layers, forming one or a plurality of circuit element patterns on a surface of each of a required number of first green sheets and a required number of second green sheets, preparing a laminate comprising a plurality of layers by superposing the first green sheets and the second green sheets each having the circuit element pattern or patterns formed thereon, and firing the laminate.

At least one of the first green sheet and the second green sheet to be arranged in contact with each other in the laminate preparing step is made to vary in composition in the direction of thickness thereof in the sheet preparing step so that one surface of said one green sheet exhibits substantially the same shrinkage as the other green sheet when fired. The above-mentioned one green sheet is superposed on the other green sheet in the laminate preparing step, with said one surface thereof facing the other green sheet.

With the process for producing the second composite device, the above-mentioned one green sheet and the other green sheet are arranged in contact with each other to form two ceramic layers and provide the second composite device of the laminate type. The firing step produces no difference in shrinkage between the two green sheets at the joint interface, consequently eliminating the likelihood that the laminate will be curved by firing and preventing the ceramic layers from cracking or separating from each other.

Stated more specifically, the first green sheet and the second green sheet are each uniform in composition in the direction of thickness thereof, lapped over each other in layers and then fired at a low temperature in this state in the sheet preparing step to thereby prepare said one green sheet. At the joint interface between the two green sheets, particles of each sheet diffuse into the other sheet, forming a green sheet wherein the surface of one green sheet exhibits substantially the same shrinkage as the other green sheet.

Alternatively, the above-mentioned one green sheet is prepared in the sheet preparing step by forming into a strip a first slurry for making the first green sheet and forming into a strip a second slurry for making the second green sheet while lapping the strips over each other in layers. At the joint interface between the two slurries, particles of each slurry diffuse into the other slurry, affording a green sheet wherein the surface of one green sheet exhibits substantially the same shrinkage as the other green sheet. If the slurries in layers are heated, the diffusion can be promoted.

The present invention provides a third composite device of the laminate type having a laminate structure of a first ceramic layer and a second ceramic layer different from each other in composition, the first ceramic layer having a three-layer structure comprising an intermediate layer having a composition serviceable as a main body, and a pair of surface layers arranged on opposite sides of the intermediate layer and having the same composition as the second ceramic layer.

In the third composite device of the invention, the first ceramic layer comprises an intermediate layer having a composition serviceable as a main body, and two surface layers having the same composition as the second ceramic layer, so that the shrinkage of the entire first ceramic layer as fired is intermediate between the shrinkage of the composition forming the intermediate layer and the shrinkage of the composition providing the surface layers (the composition of the second ceramic layer). Consequently the first ceramic layer is less different from the second ceramic layer in shrinkage than the conventional first ceramic layer which is entirely made from the composition providing the main body. Further the joint between the first and second ceramic layers of the invention involves no difference in shrinkage since layers of the same composition are joined to each other at this joint.

Accordingly, when the laminate structure of the first and second ceramic layers is formed by the firing step in fabricating the third composite device of the laminate type embodying the invention, it is unlikely that a great difference will occur between the first and second ceramic layers in shrinkage, consequently diminishing the deflection of the ceramic layers. This prevents the ceramic layers from cracking or separating from each other.

Stated more specifically, the intermediate layer of the first ceramic layer is a magnetic body, and the second ceramic layer is a dielectric. An L-pattern is then formed on the surface of the first ceramic layer, and a C-pattern on the surface of the second ceramic layer. In this case, the first ceramic layer has its main body provided by the magnetic body, retaining the properties of magnetic body. Each ceramic layer is made from a material suited to the characteristic value to be exhibited by the pattern thereof, so that even if the pattern has the same size as in the prior art, the pattern exhibits a more excellent characteristic value than conventionally. This serves to diminish the pattern size to render the composite device of the laminate type compact.

Alternatively, the intermediate layer of the first ceramic layer is a dielectric, and the second ceramic layer is a magnetic body. A C-pattern is then formed on the surface of the first ceramic layer, and an L-pattern on the surface of the second ceramic layer.

The present invention provides a process for producing the third composite device of the laminate type having the steps of:

preparing first green sheets for making first ceramic layers and second green sheets for making second ceramic layers, forming one or a plurality of circuit element patterns on a surface of each of a required number of first green sheets and a required number of second green sheets, preparing a laminate comprising a plurality of layers by superposing the first green sheets and the second green sheets each having the circuit element pattern or patterns formed thereon, and firing the laminate.

The first green sheets are each given by the sheet preparing step a three-layer structure comprising an intermediate layer of a composition serviceable as a main body and a pair of surface layers arranged on opposite sides of the intermediate layer and having the same composition as the second green sheet.

The process of the invention described prepares a first ceramic layer of three-layer structure from the first green sheet of three-layer structure, and a second ceramic layer from the second green sheet through the firing step, providing a third composite device having a laminate structure comprising two layers.

The first green sheet to be subjected to the firing step comprises an intermediate layer having a composition for making a main body, and two surface layers having the same composition as the second green sheet, so that the shrinkage of the entire first green sheet is intermediate between the shrinkage of the composition forming the intermediate layer and the shrinkage of the composition providing the surface layers (the composition of the second ceramic layer). Consequently the first green sheet is less different from the second green sheet in shrinkage than the conventional first green sheet which is entirely made from the composition providing the main body. Further the joint between the first and second sheets of the invention involves no difference in shrinkage since layers of the same composition are joined to each other at this joint. Accordingly, it is unlikely that a great difference will occur between the first and second green sheets in shrinkage, consequently diminishing the deflection of the ceramic layers by firing. This prevents the ceramic layers from cracking or separating from each other.

Stated more specifically, the second green sheet is lapped over each of opposite sides of an intermediate green sheet for making the intermediate layer, and the resulting assembly of the sheets is fired at a low temperature, whereby each of the first green sheets is prepared. The first green sheet can be prepared by drying the assembly of sheets instead of resorting to low-temperature firing. At the joint interface between the intermediate green sheet and each second green sheet, particles of each green sheet diffuse into the other green sheet to join the two sheets in intimate contact with each other with high strength at the joint.

Alternatively, while a slurry for use as a material for the second green sheet is formed into a strip, a slurry for use as a material for the intermediate layer is formed into a strip over the surface of the strip and a slurry for use as the material for the second green sheet is formed into a strip over the surface of the second-mentioned strip, whereby each of the first green sheets is prepared. At each joint interface between the slurry for making the intermediate layer and the slurry for making the second green sheet, particles of each slurry diffuse into the other slurry to produce a joint of high strength.

As described above, the present invention providing composite devices of the laminate type and processes for fabricating such devices diminishes the deflection of the ceramic layers in the firing step to thereby eliminate the problem of cracking and separation and achieve an improved yield.

BRIEF DESCRIPTION OF THE DRAWINGS

FIG. 19($b$) is an enlarged view of the portion A in FIG. 18 after firing.

DETAILED DESCRIPTION OF EMBODIMENTS

Embodiments of the present invention will be described below in detail with reference to the drawings.

First Embodiment

Figure 1:
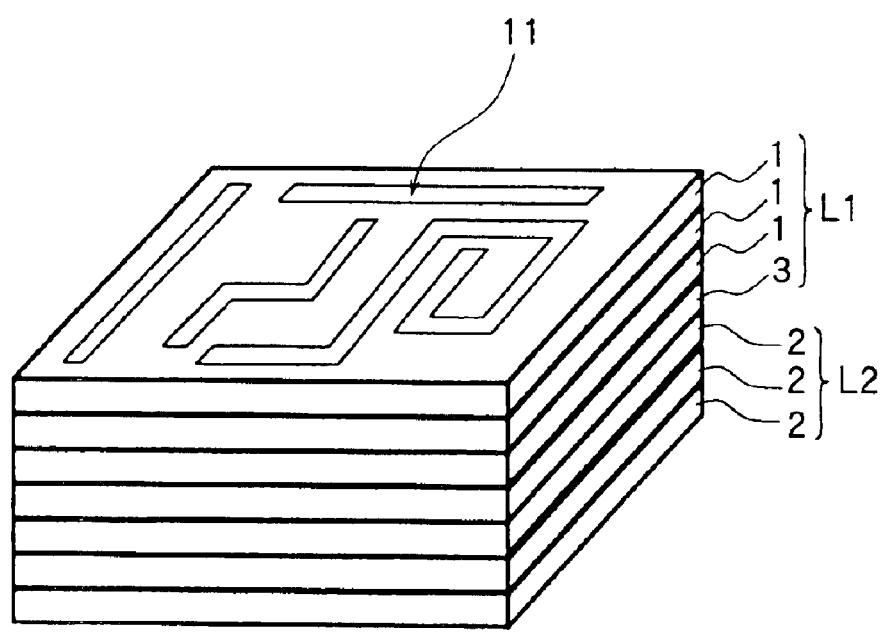
FIG. 1 is a perspective view of a first composite device of the laminate type embodying the invention.

As shown in FIG. 1, the composite device of the laminate type according to this embodiment has a laminate structure including an upper half laminate portion L1 comprising a plurality of magnetic body ceramic layers 1, a lower half laminate portion L2 comprising a plurality of dielectric ceramic layers 2, and an intermediate layer 3 interposed between the two laminate portions. Composite devices of the laminate type comprising at least three laminate portions also have an intermediate layer between a magnetic body laminate portion and a dielectric laminate portion.

Figure 3:
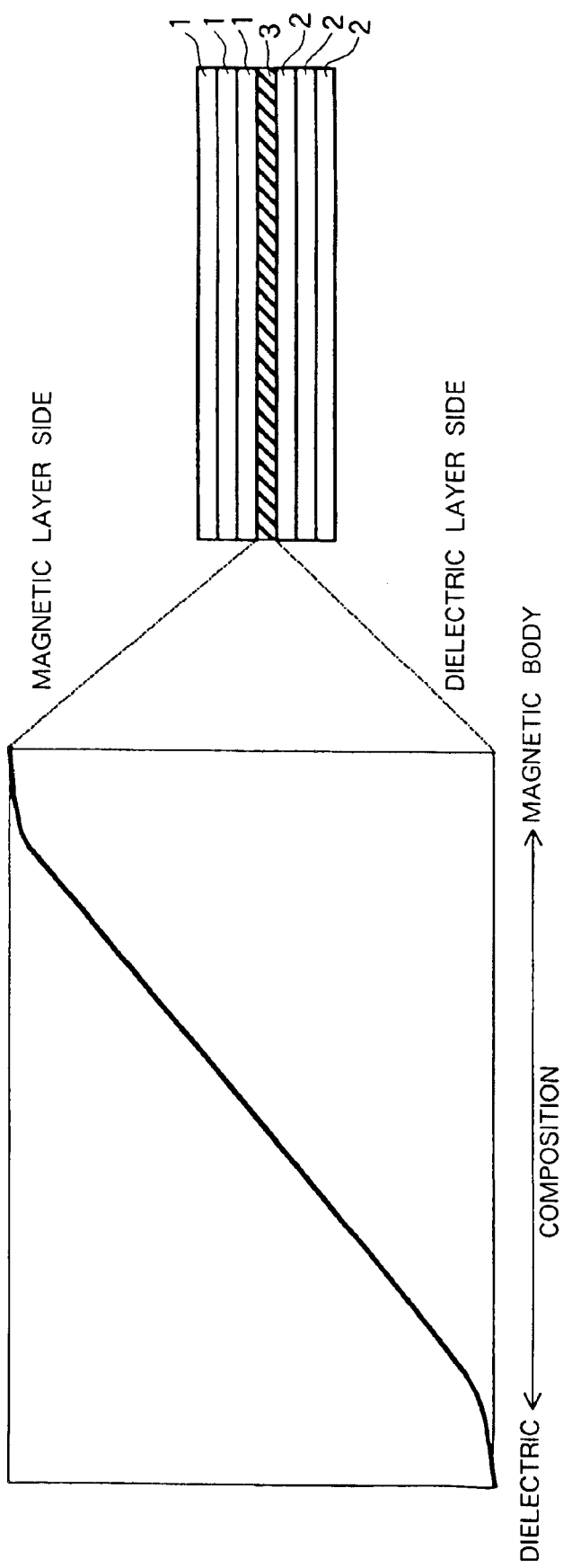
FIG. 3 is a diagram for illustrating variations in the composition of an intermediate layer constituting the device.

With reference to FIG. 3, the intermediate layer 3 has the same composition as the magnetic body ceramic layer 1 in the vicinity of the junction of the layers 1, 3 and the same composition as the dielectric ceramic layer 2 in the vicinity of the junction of the layers 2, 3, and continuously varies in composition in the direction of thickness of the layer 3.

Figure 2:
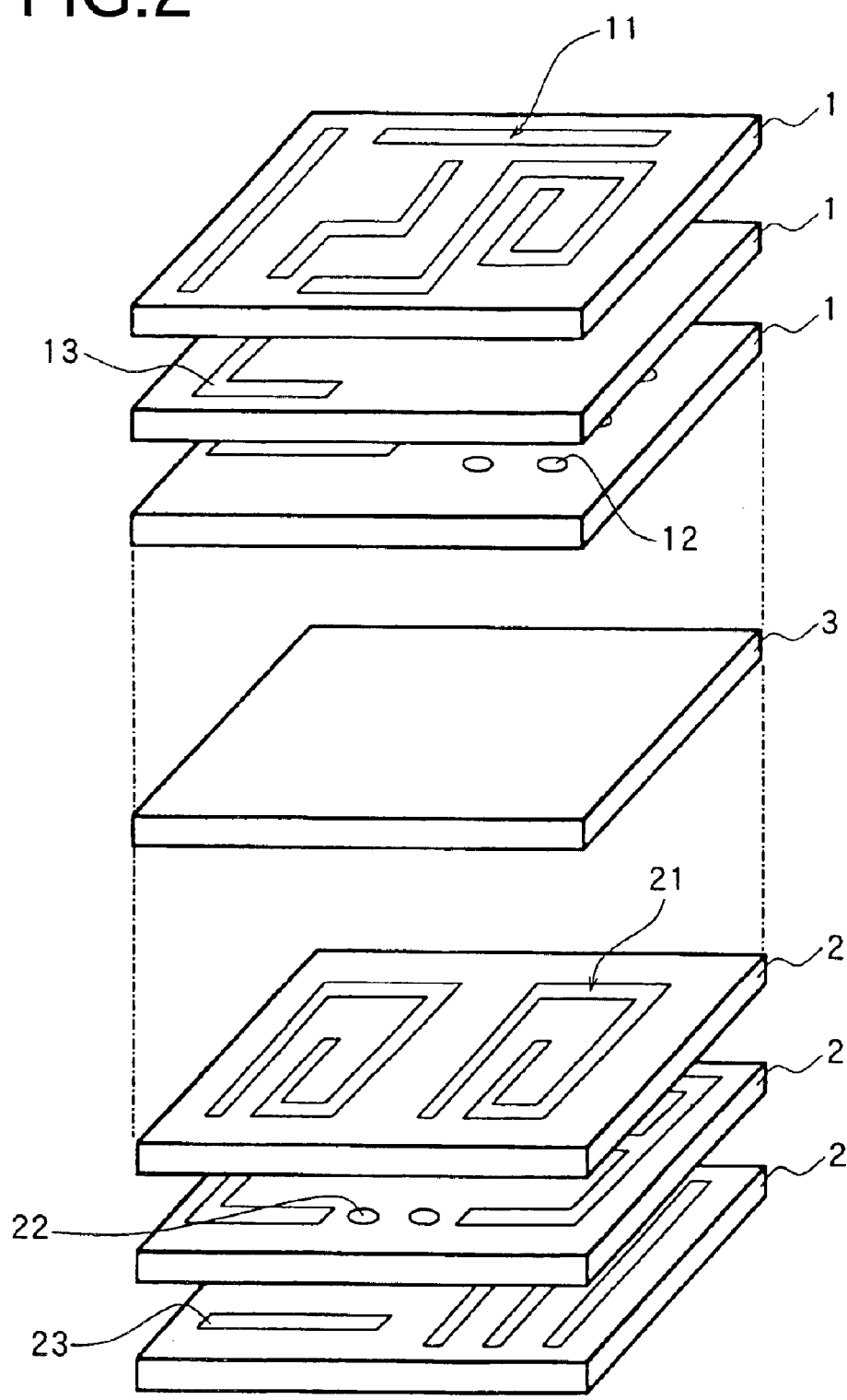
FIG. 2 is an exploded perspective view of the device.

With reference to FIG. 2, formed on the surface of each magnetic body ceramic layer 1 are a plurality of circuit element patterns 11 chiefly including L-patterns. Formed on the surface of each dielectric ceramic layer 2 are a plurality of circuit element patterns 21 chiefly including C-patterns. Specified ceramic layers 1, 2 are provided with a conductor pattern 13 or 23 and via holes 12 or 22 for establishing electrical continuity with circuit element patterns on the same or underlying ceramic layer. When required, the intermediate layer 3 is also provided with a conductor pattern or conduction channel (not shown) for effecting electrical conduction between the magnetic body ceramic layer 1 and the dielectric ceramic layer 2 arranged on opposite sides thereof.

The magnetic body ceramic layer 1 is made from a material, such as an Ni—Zn—Cu ferrite, Ni—Zn ferrite or hexagonal ferrite, which gives magnetic permeability to the layer 1. Various glasses such as borosilicate glass may be added to the material to lower the firing temperature. The Ni—Zn—Cu ferrite is not limited particularly; one of such ferrites of various compositions can be selected depending on the purpose. For example, such a ferrite is preferably 15 to 25 mole % in NiO content, 5 to 15 mole % in CuO content and 20 to 30 mole % in ZnO content. The Ni—Zn ferrite is not limited specifically, either, but one of such ferrites having various compositions can be selected according to the purpose. For example, such a ferrite is preferably 10 to 25 mole % in NiO content and 15 to 45 mole % in ZnO content.

The material for the dielectric ceramic layer 2 can be, for example, a material having a low dielectric constant and consisting mainly of barium oxide, aluminum oxide or silica, dielectric material of the titanium oxide type, glass ceramic material, or the like. Borosilicate glass or the like may be used to lower the firing temperature.

In fabricating the composite device of the laminate type of the invention described, green sheets of magnetic body for making the magnetic body ceramic layers 1, dielectric green sheets for making the dielectric ceramic layers 2, and an intermediate green sheet for making the intermediate layer 3 are prepared first. The magnetic body green sheet and the dielectric green sheet are prepared by the doctor blade method or the like as in the prior art.

Figure 4:
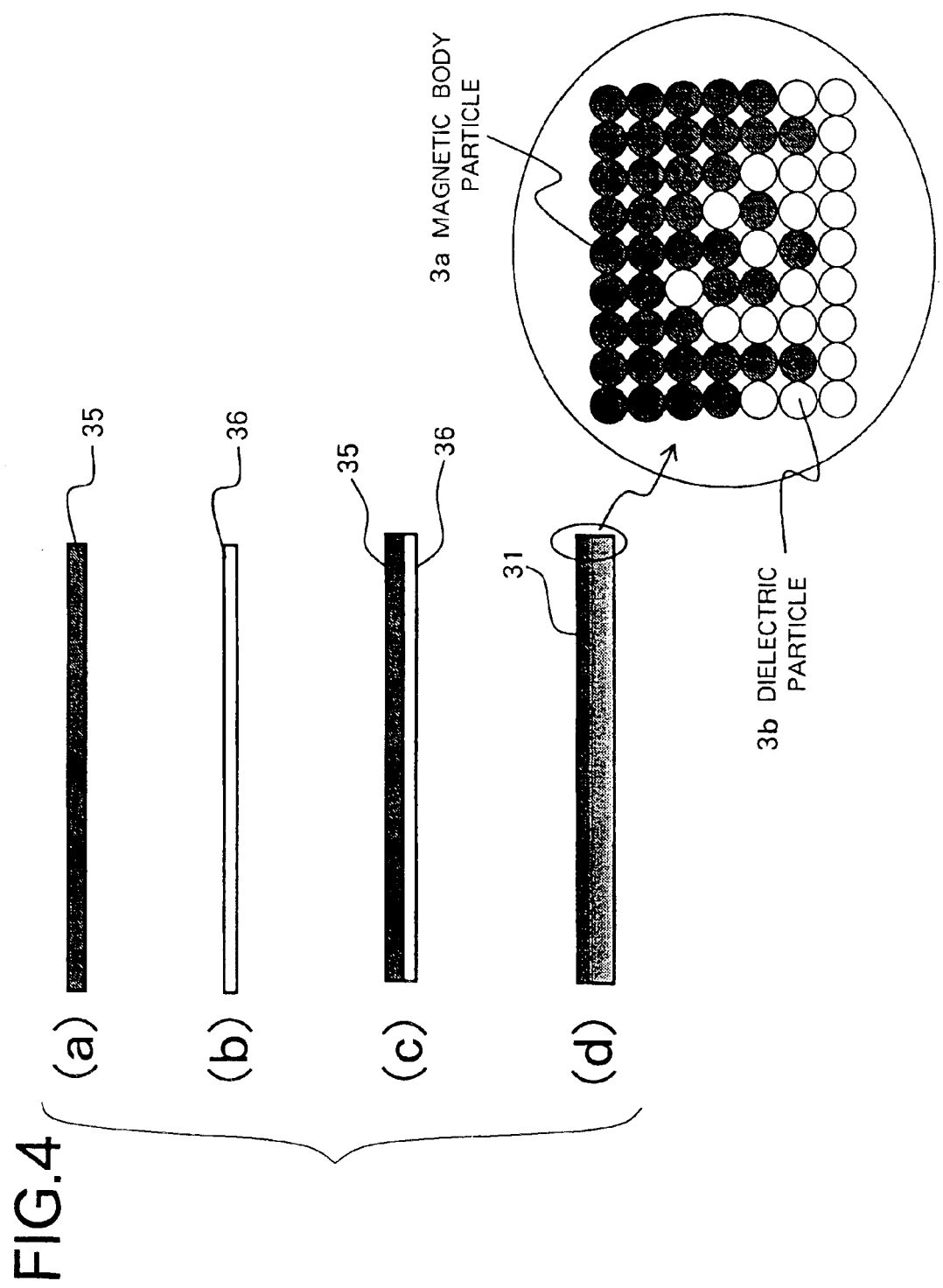
FIG. 4 is a diagram for illustrating a process for preparing the intermediate layer.

FIG. 4 shows a process for preparing the intermediate green sheet 31. First, a magnetic body green sheet 35 shown in FIG. 4(a) and a dielectric green sheet 36 shown in FIG. 4(b) are prepared, for example, by the doctor blade method, these green sheets 35, 36 are thereafter lapped over each other as seen in FIG. 4(c), and the two green sheets 35, 36 are fired in this state at a low temperature of about 200° C. Consequently, magnetic body particles 3a in the green sheet 35 diffuse through the dielectric green sheet 36, and dielectric particles 3b in the green sheet 36 diffuse through the magnetic body green sheet 35 as shown in FIG. 4(d), whereby the intermediate green sheet 31 is obtained which continuously varies in composition in the direction of thickness thereof.

Figure 5:
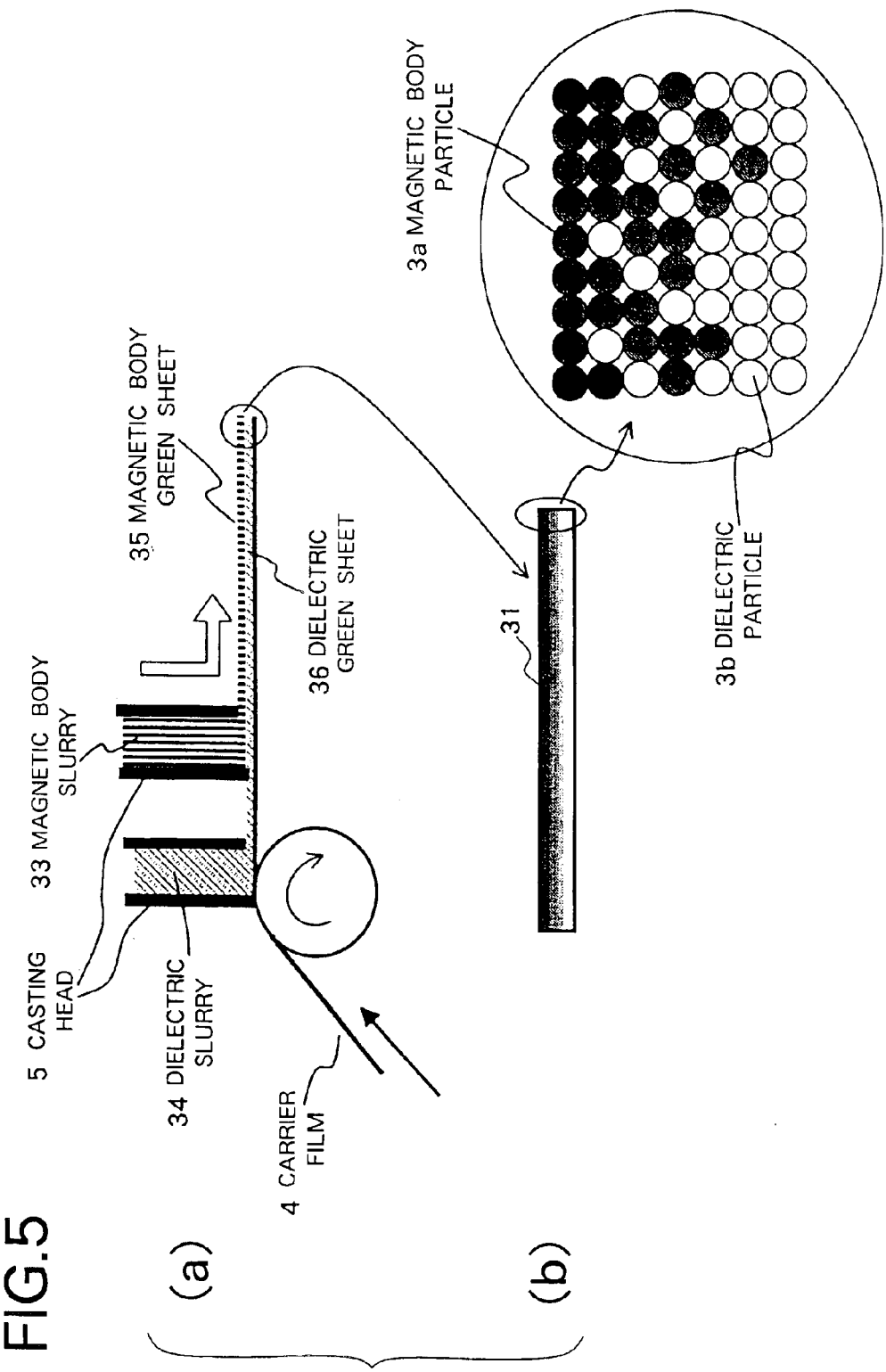
FIG. 5 is a diagram for illustrating another process for preparing the intermediate layer.

FIG. 5 shows another process for preparing the intermediate green sheet 31. Two casting heads 5, 5 are arranged above a carrier film 4 as spaced apart along the direction of transport of the film, and are supplied with a dielectric slurry 34 and a magnetic body slurry 33 as seen in FIG. 5(a). The magnetic body slurry 33 can be prepared in the following manner. First, specified amounts of material powders for a ferrite, e.g., of powders of NiO, ZnO, CuO, $Fe_2O_3$, etc. are weighed out, and then mixed together and pulverized in a ball mill comprising alumina pot and balls. The resulting mixture is temporarily fired and thereafter pulverized in the ball mill again. A binder is added to the mixture powder obtained, followed by mixing wet in a ball mill. The mixture is then dried and classified to obtain a powder, to which a solvent (IPA) is added to prepare the magnetic body slurry 33.

The carrier film 4 is transported at a specified speed to thereby apply the dielectric slurry 34 delivered from the front casting head 5 onto the film 4 to a predetermined thickness and further apply the magnetic body slurry 33 delivered from the rear casting head 5 onto the surface of the resulting coating to a predetermined thickness, whereby the two slurries 34, 33 are superposed on the film to obtain a laminate green sheet comprising a dielectric green sheet 36 and a magnetic body green sheet 35 joined thereto. Since the two green sheets 36, 35 each in the form of a slurry are arranged in layers in the laminate green sheet thus obtained, magnetic body particles 3a in the green sheet 35 diffuse through the dielectric green sheet 36, and dielectric particles 3b in the green sheet 36 diffuse through the magnetic body green sheet 35 as shown in FIG. 5(b), with the result that a period of time later, an intermediate green sheet 31 is obtained which continuously varies in composition in the direction of thickness. If the laminate green sheet on the carrier film 4 is heated, promoted diffusion can be attained. As a result, the intermediate green sheet 31 continuously varying in composition over the entire thickness thereof can be prepared within a shortened period of time.

Next, a plurality of circuit element patterns are printed with silver on the surface of each of a required number of magnetic body green sheets and a required number of dielectric green sheets to obtain magnetic body boards and dielectric boards. The magnetic body boards are arranged in superposed layers to obtain a laminate of magnetic body boards, and the dielectric boards are superposed in layers to obtain a laminate of dielectric boards. A composite laminate is prepared by sandwiching the intermediate green sheet between these laminates.

The composite laminate is thereafter fired at a high temperature of 800° C. to 1000° C. to obtain an integral sintered laminate. Finally a plurality of electronic components are mounted on the surface of the sintered laminate as required to complete a composite device of the laminate type in the form of a single chip.

In the composite device of the laminate type described above and shown in FIG. 1, the intermediate layer 3 which varies in composition in the direction of thickness thereof is interposed between the magnetic body ceramic layer 1 and the dielectric ceramic layer 2 to continuously vary the shrinkage of the intermediate layer 3 during firing in the direction of thickness thereof from the joint interface between the layers 1 and 3 to the joint interface between the layers 3 and 2, giving the former interface the same shrinkage as the magnetic body ceramic layer 1 and giving the latter interface the same shrinkage as the dielectric ceramic layer 2. This prevents the magnetic body ceramic layer 1 and the dielectric ceramic layer 2 from curving during the firing step to inhibit the ceramic layer 1 or 2 from cracking or separating. As a result, a higher yield can be achieved than conventionally.

The process for preparing the intermediate layer 3 is not limited to those described above. Also usable is a process for forming a thin film which varies in composition in the direction of thickness thereof by resorting to sputtering, vacuum evaporation or plating. Furthermore, the low-temperature firing step shown in FIG. 4(d) can be dispensed with. In this case, magnetic body particles and dielectric particles are diffused by the high-temperature firing step to form an intermediate layer which varies in composition in the direction of thickness thereof.

Second Embodiment

Figure 6:
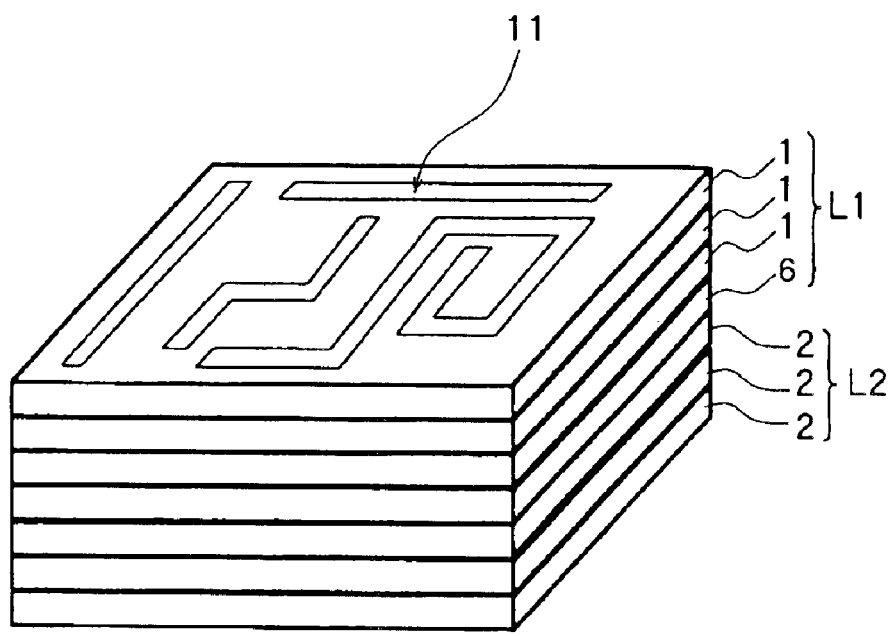
FIG. 6 is a perspective view of a second composite device of the laminate type embodying the invention.
Figure 8:
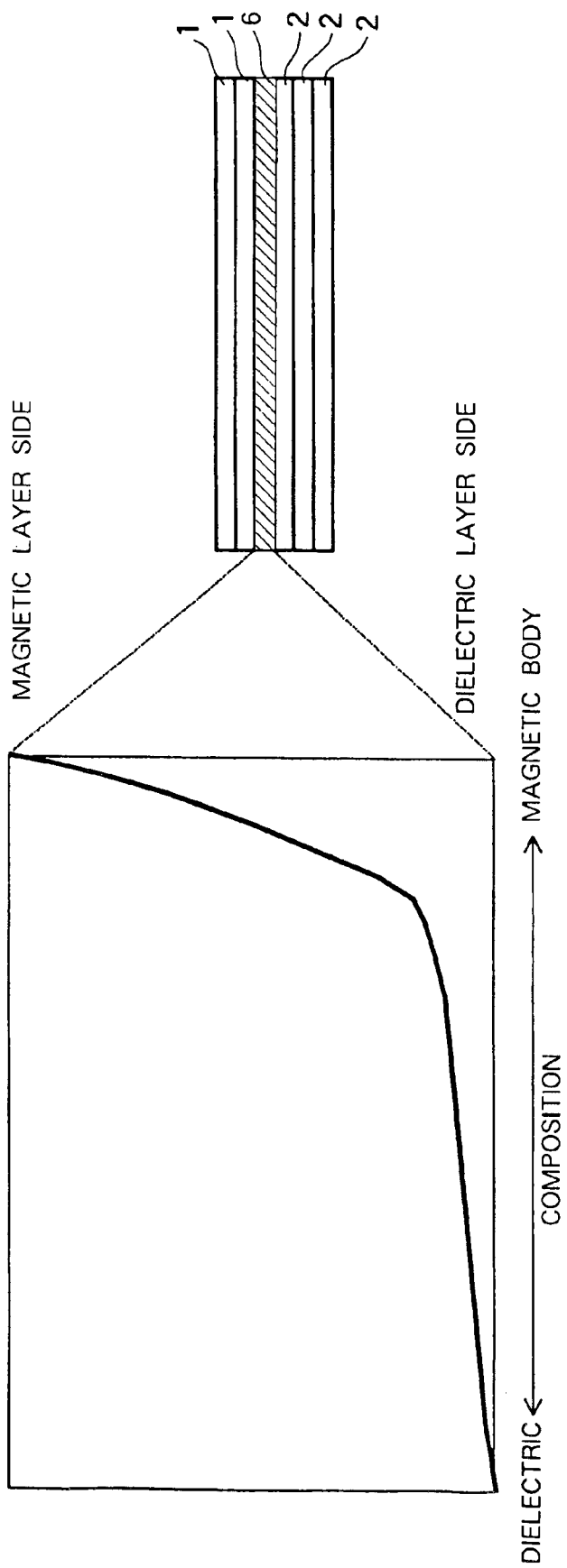
FIG. 8 is a diagram for illustrating variations in the composition of a magnetic body ceramic layer constituting the device.

As shown in FIG. 6, the composite device of the laminate type according to this embodiment has an upper half laminate portion L1 comprising a plurality of magnetic body ceramic layers 1, 6, and a lower half laminate portion L2 comprising a plurality of dielectric ceramic layers 2. The magnetic body ceramic layer 6 included in the laminate portion Li and in contact with the dielectric ceramic layer 2 varies in composition in the direction of thickness thereof as shown in FIG. 8, has the same composition as the dielectric ceramic layer 2 at the joint thereof with the layer 2 and nearly the same composition as the layer 2 in a thin surface layer portion thereof in the vicinity of the joint, and is almost same as the magnetic body ceramic layer 1 in the other major portion thereof.

Figure 7:
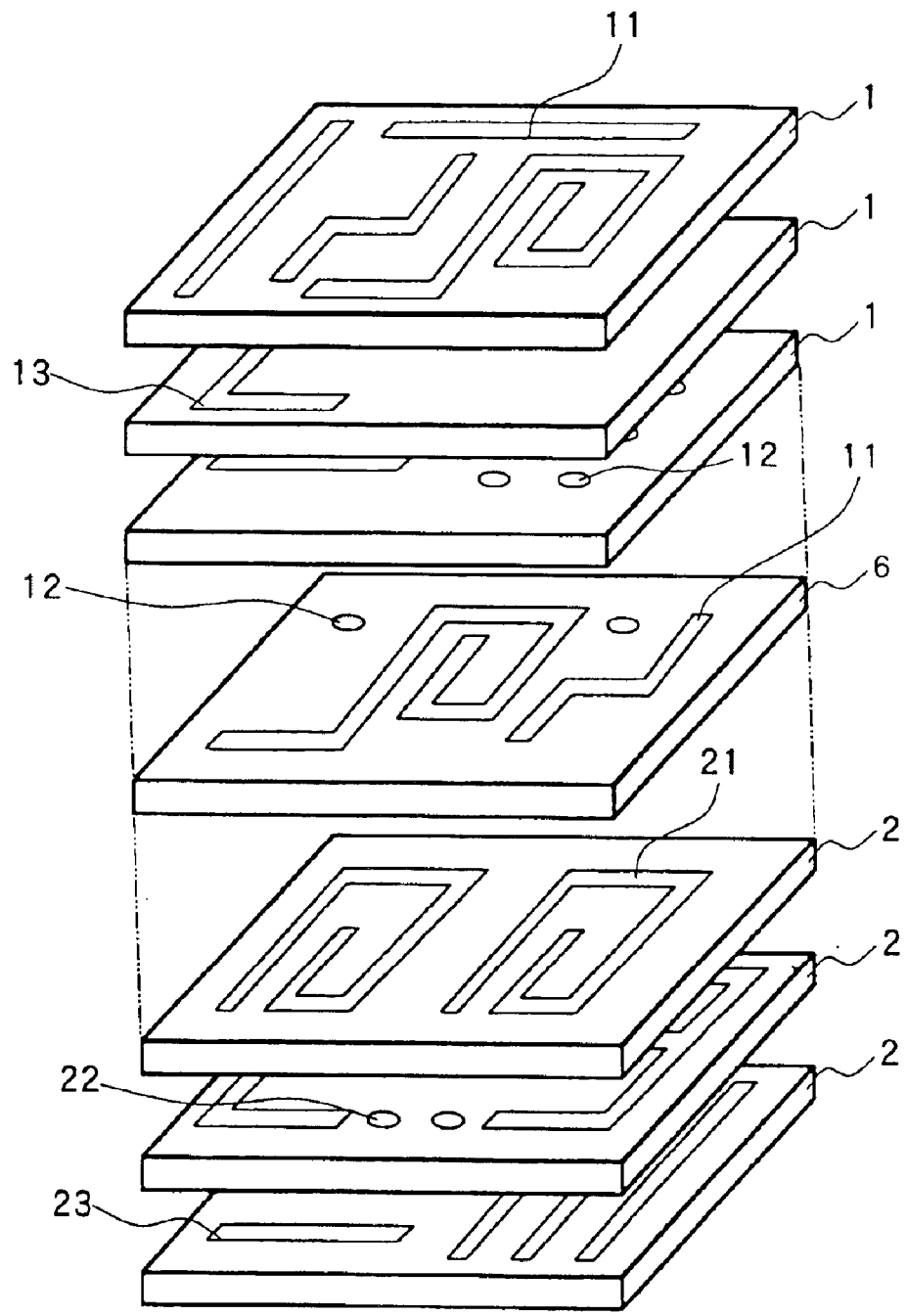
FIG. 7 is an exploded perspective view of the device.

With reference to FIG. 7, a plurality of circuit element patterns 11 chiefly including L-patterns are formed on the surface of each magnetic body ceramic layer 1 and the surface of the magnetic body ceramic layer 6 in contact with the dielectric ceramic layer 2. Formed on the surface of each dielectric ceramic layer 2 are a plurality of circuit element patterns 21 chiefly including C-patterns. Specified ceramic layers are provided with a conductor pattern 13 or 23 and via holes 12 or 22 for establishing electrical continuity with circuit element patterns on the same or underlying ceramic layer.

The magnetic body ceramic layer 1 can be made from various materials the same as those useful for forming the magnetic body ceramic layer included in the foregoing first embodiment. The dielectric ceramic layer 2 can be made from the same materials as those for use in forming the dielectric ceramic layer of the first embodiment.

In fabricating the composite device of the laminate type of the invention described, green sheets of magnetic body for making the magnetic body ceramic layers 1 and dielectric green sheets for making the dielectric ceramic layers 2 are prepared first by the doctor blade method or the like as in the prior art. A magnetic green sheet is also prepared for making the magnetic ceramic layer 6 which varies in composition in the direction of thickness thereof.

Figure 9:
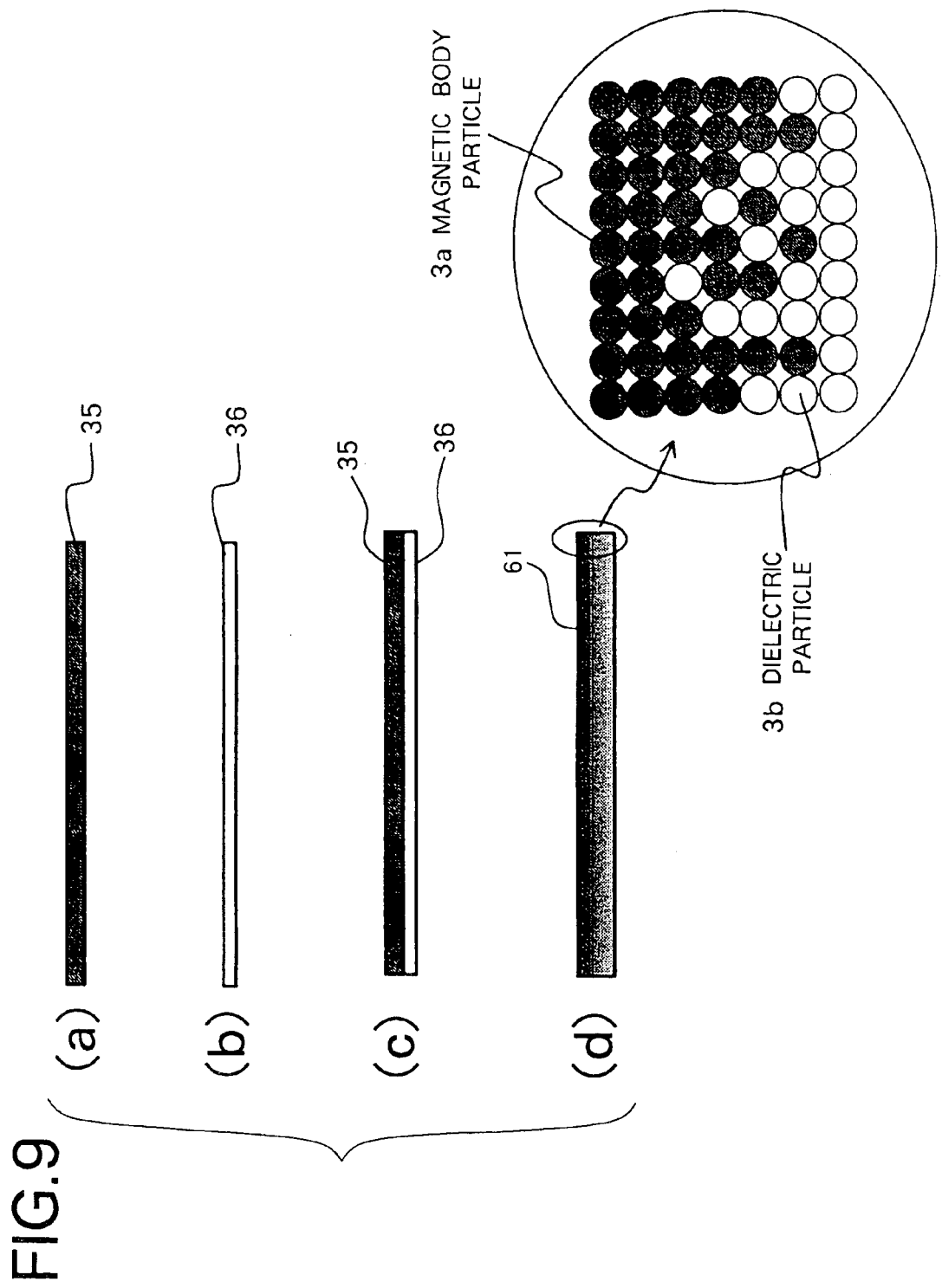
FIG. 9 is a diagram for illustrating a process for preparing the magnetic body ceramic layer.

FIG. 9 shows a process for preparing a green sheet 61 of magnetic body for making the layer 6 varying in composition in the direction of thickness. First, a magnetic body green sheet 35 shown in FIG. 9(a) and a dielectric green sheet 36 shown in FIG. 9(b) are prepared, for example, by the doctor blade method. These green sheets 35, 36 are so formed that the sheet 35 is greater than the sheet 36 in thickness. The green sheets 35, 36 are thereafter lapped over each other as seen in FIG. 9(c), and fired in this state at a low temperature of about 200° C. Consequently, magnetic body particles 3a in the green sheet 35 diffuse through the dielectric green sheet 36, and dielectric particles 3b in the green sheet 36 diffuse through the magnetic body green sheet 35 as shown in FIG. 9(d), whereby a magnetic body green sheet 61 is obtained wherein the content of dielectric particles 3b increases from portion to portion toward one surface of the sheet.

Figure 10:
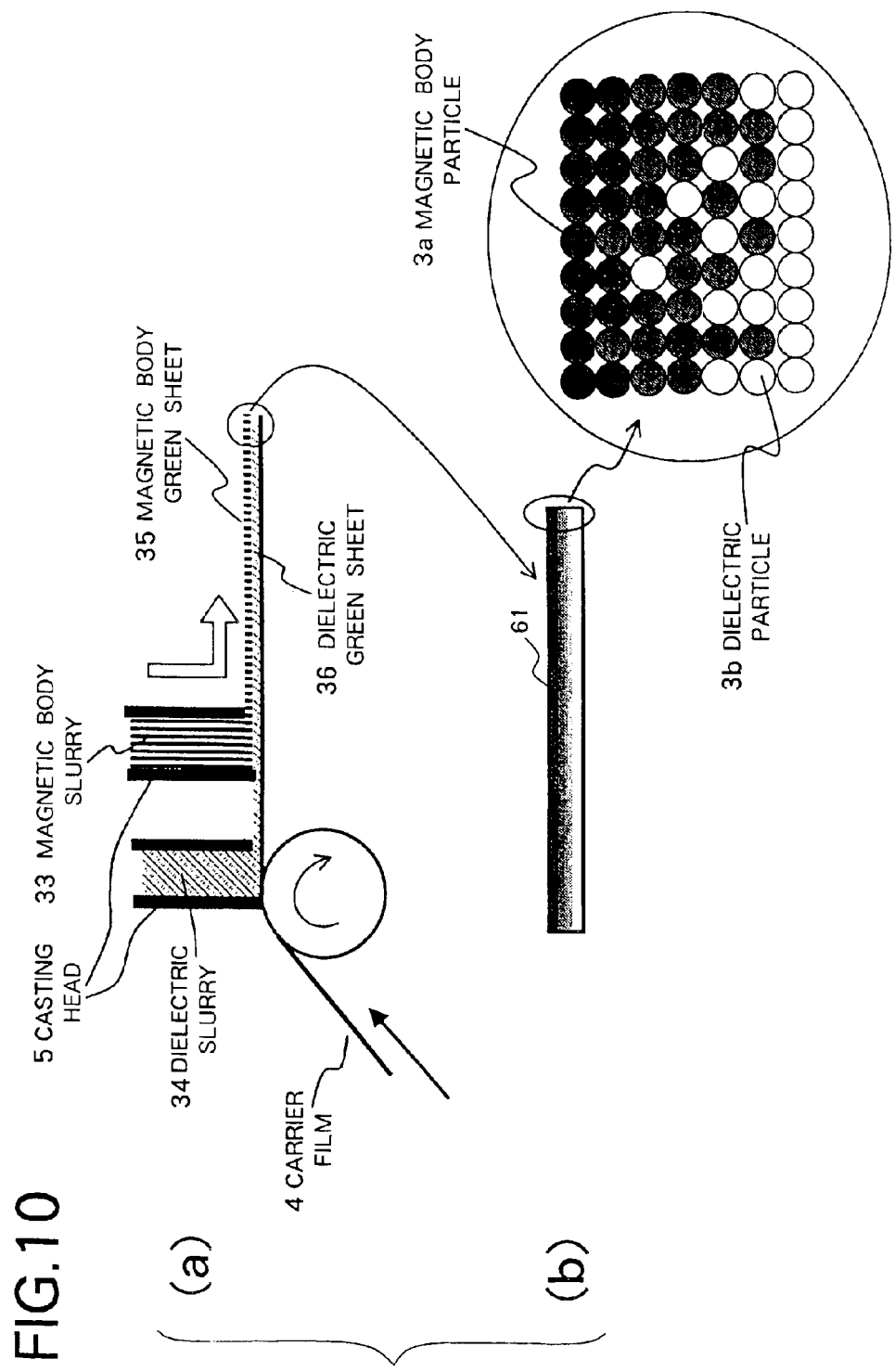
FIG. 10 is a diagram for illustrating another process for preparing the magnetic body ceramic layer.

FIG. 10 shows another process for preparing the magnetic body green sheet 61. As in the process for preparing the intermediate green sheet for the first embodiment, a dielectric slurry 34 delivered from a front casting head 5 is applied onto a carrier film 4 to a predetermined thickness and a magnetic body slurry 33 delivered from a rear casting head 5 is further applied onto the surface of the resulting coating to a predetermined thickness. The gaps between the film 4 and the two casting heads 5, 5 are so adjusted that the magnetic body slurry 33 is larger than the dielectric slurry 34 in coating thickness. In this way, the two slurries 34, 33 are superposed on the film to obtain a laminate green sheet comprising a dielectric green sheet 36 and a magnetic body green sheet 35 joined thereto. Since the two green sheets 36, 35 each in the form of a slurry are arranged in layers in the laminate green sheet thus obtained, magnetic body particles 3a in the green sheet 35 diffuse through the dielectric green sheet 36, and dielectric particles 3b in the green sheet 36 diffuse through the magnetic body green sheet 35 as shown in FIG. 10(b), with the result that a period of time later, a magnetic body green sheet 61 is obtained which increases in the content of dielectric particles 3b from portion to portion toward one surface thereof and continuously varies in composition in the direction of thickness thereof. If the laminate green sheet on the carrier film 4 is heated, promoted diffusion can be attained, consequently shortening the time required for diffusion.

Next, a plurality of circuit element patterns are printed with silver on the surface of each of a required number of magnetic body green sheets and a required number of dielectric green sheets to obtain magnetic body boards and dielectric boards. The magnetic body boards are arranged in superposed layers to obtain a laminate of magnetic body boards, and the dielectric boards are superposed in layers to obtain a laminate of dielectric boards. The magnetic body green sheet varying in composition in the direction of thickness is used for the magnetic body board to be brought into contact with the laminate of dielectric boards. The laminate of magnetic body boards and the laminate of dielectric boards are joined in layers to obtain a composite laminate.

The composite laminate is thereafter fired at a high temperature of 800° C. to 1000° C. to prepare an integral sintered laminate. Finally a plurality of electronic components are mounted on the surface of the sintered laminate as required to complete a composite device of the laminate type in the form of a single chip.

The composite device of the laminate type described above is so adapted that the magnetic body ceramic layer 6 in contact with the dielectric ceramic layer 2 varies in composition in the direction of thickness as shown in FIG. 8, to thereby vary the layer 6 in shrinkage in the direction of thickness thereof during firing and give the joint interface between the layer 6 and the dielectric ceramic layer 2 the same shrinkage as the layer 2. This prevents the magnetic body ceramic layer 1 and the dielectric ceramic layer 2 from curving during the firing step to inhibit the ceramic layer 1 or 2 from cracking or separating. As a result, a higher yield can be achieved than conventionally.

Furthermore, the magnetic body ceramic layer 6 in contact with the dielectric ceramic layer 2 is low in the content of dielectric particles 3b in a major portion thereof other than the vicinity of the joint thereof with the dielectric ceramic layer 2, and therefore retains the function of a magnetic body, affording a great inductance when provided with an L-pattern on the surface thereof. Accordingly, the construction described is unlikely to make the composite device of the laminate type greater in size due to an increase in the number of laminated layers.

Incidentally, it is possible to continuously vary the dielectric ceramic layer in composition in the direction of thickness thereof to thereby increase the layer in the content of magnetic particles from portion to portion toward one surface thereof. Furthermore, a dielectric ceramic layer and a magnetic body ceramic layer as arranged in contact with each other can each be made to continuously vary in composition in the direction of thickness thereof so as to make the two layers identical in composition at the joint therebetween.

Additionally, the process for preparing the magnetic body ceramic layer 6 continuously varying in composition in the direction of thickness thereof is not limited to those described above. Also usable is a process for forming a thin film which varies in composition in the direction of thickness thereof by resorting to sputtering, vacuum evaporation or plating. Furthermore, the low-temperature firing step shown in FIG. 9(d) can be dispensed with. In this case, magnetic body particles and dielectric particles are diffused by the high-temperature firing step to form a magnetic body ceramic layer which varies in composition in the direction of thickness thereof.

Third Embodiment

Figure 11:
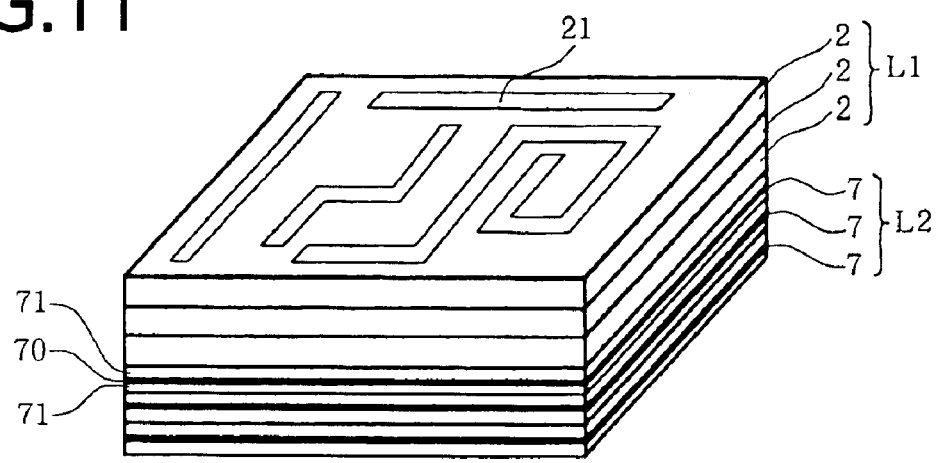
FIG. 11 a perspective view of a third composite device of the laminate type embodying the invention.

As shown in FIG. 11, the composite device of the laminate type according to this embodiment has an upper half laminate portion L1 comprising a plurality of dielectric ceramic layers 2, and a lower half laminate portion L2 comprising a plurality of composite ceramic layers 7. Each of the composite ceramic layers 7 has a three-layer structure comprising an intermediate layer 70 of magnetic body ceramic material, and a pair of surface layers 71, 71 of dielectric ceramic material arranged on opposite sides of the intermediate layer 70.

Figure 12:
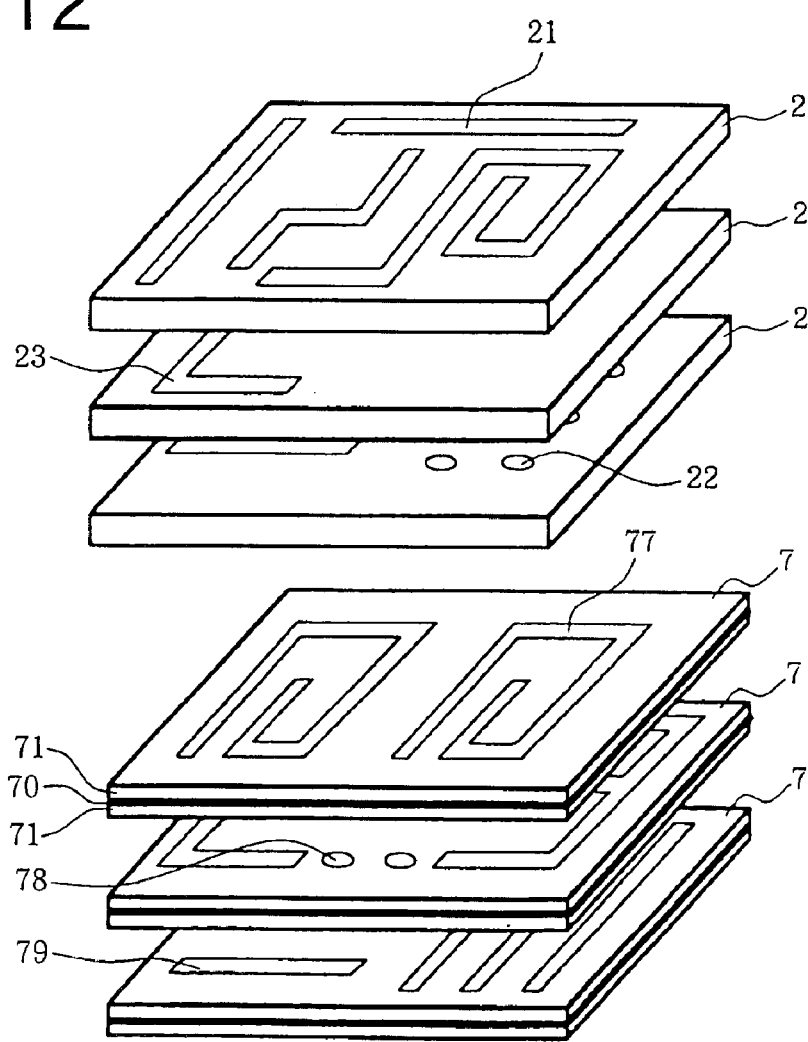
FIG. 12 is an exploded perspective view of the device.

With reference to FIG. 12, a plurality of circuit element patterns 21 chiefly including C-patterns are formed on the surface of each dielectric ceramic layer 2, and a plurality of circuit element patterns 77 chiefly including L-patterns are formed on the surface of each composite ceramic layer 7. Specified ceramic layers are provided with a conductor pattern 23 or 79 and via holes 22 or 78 for establishing electrical continuity with circuit element patterns on the same or underlying ceramic layer.

Figure 13:
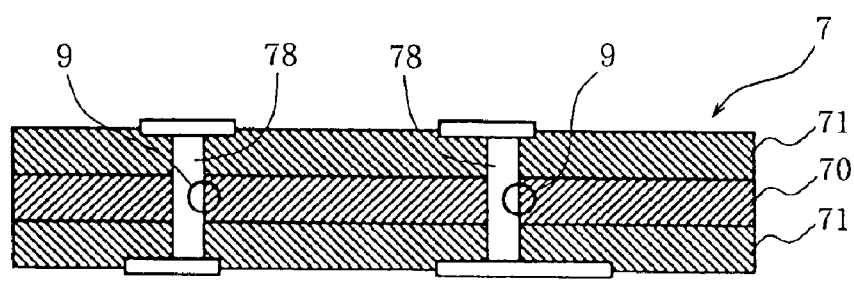
FIG. 13 is a sectional view of a composite ceramic layer constituting the device.

The intermediate layer 70 of the composite ceramic layer 7 can be made from various magnetic body ceramic materials the same as those exemplified for the first embodiment for forming the magnetic body ceramic layer. In the case where an Ni—Zn ferrite having great electrical resistance is used for the layer 70, the current flowing through the via hole 78 can be prevented from leaking to the intermediate layer 70 at a portion 9 of contact between the wall of the hole 78 and the layer 70 shown in FIG. 13. The dielectric ceramic layer 2 can be made from the same materials as those for use in forming the dielectric ceramic layer of the first embodiment.

In fabricating the composite device of the laminate type of the invention described, dielectric green sheets for making the dielectric ceramic layers 2 are prepared first by the doctor blade method or the like as in the prior art. Also prepared are composite green sheets for making the composite ceramic layers of three-layer structure.

Figure 14:
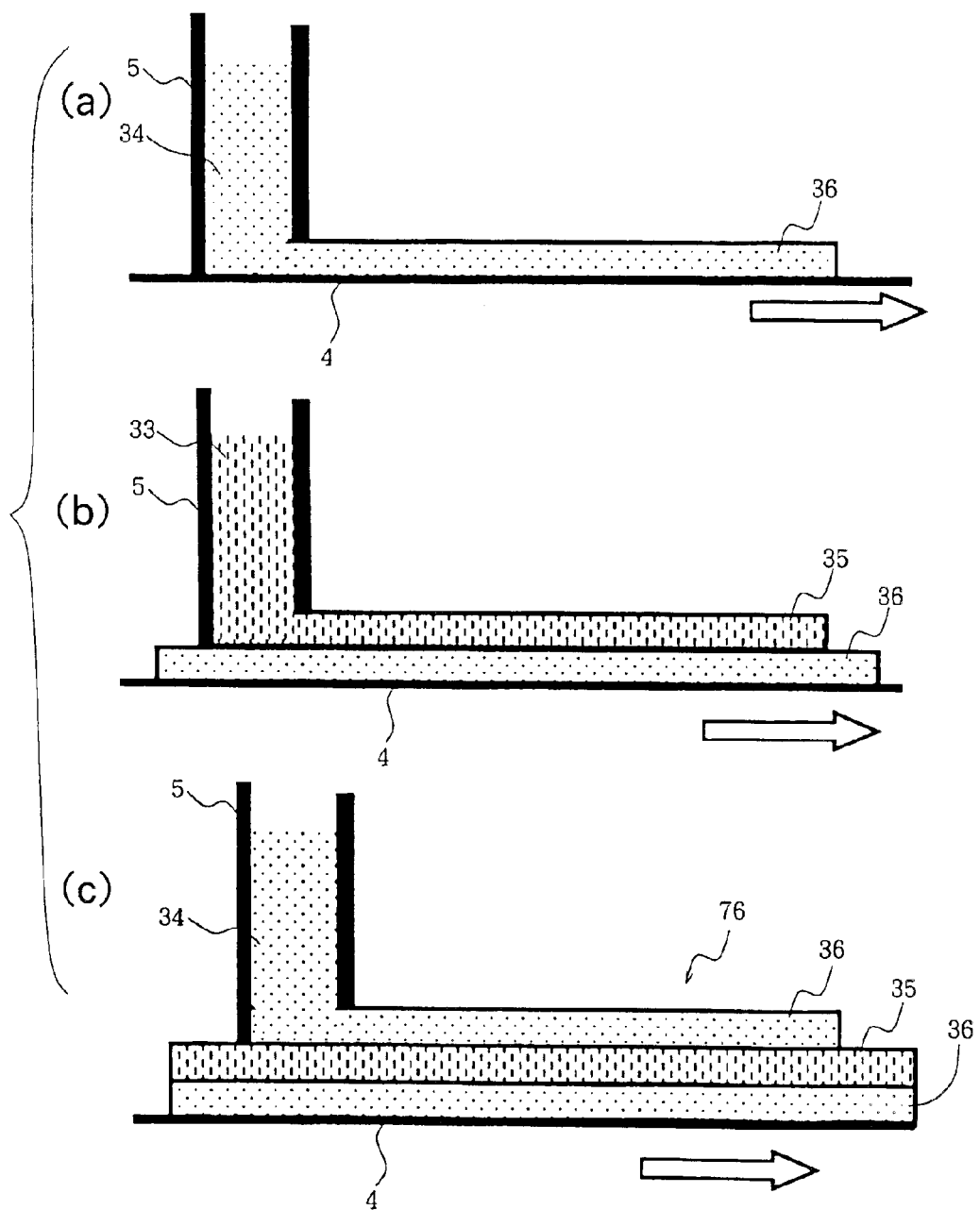
FIG. 14 is a diagram for illustrating a process for preparing the composite ceramic layer.

FIG. 14 shows a process for preparing the composite green sheet 76 for making the composite ceramic layer 7 of three-layer structure. As shown in FIG. 14(*a*), a dielectric slurry 34 is first supplied to the inside of a casting head 5 disposed above a carrier film 4. The carrier film 4 is transported at a predetermined speed, whereby the slurry 34 delivered from the casting head 5 is applied onto the carrier film 4 to a specified thickness for the preparation of a dielectric green sheet 36. Next, a magnetic body slurry 33 is applied onto the dielectric green sheet 36 to a predetermined thickness as seen in FIG. 14(*b*) for the preparation of a magnetic body green sheet 35. Further applied onto the green sheet 35 to a predetermined thickness is the dielectric slurry 34 as seen in FIG. 14(*c*) for the preparation of a dielectric green sheet 36. The carrier film 4 is then removed, and the assembly of superposed green sheets 36, 35, 36 is fired at a low temperature of about 200° C. The assembly may be dried instead of being fired at the low temperature. As a result, at each of the joint interfaces between the three green sheets 36, 35, 36, magnetic body particles in the magnetic body green sheet 35 diffuse into the dielectric green sheet 36, while dielectric particles in the dielectric green sheet 36 diffuse into the green sheet 35, whereby a composite green sheet 76 is obtained which comprises the three joined green sheets 36, 35, 36. Incidentally, the magnetic body slurry 33 is prepared in the same manner as like slurry used for the first embodiment.

Figure 15:
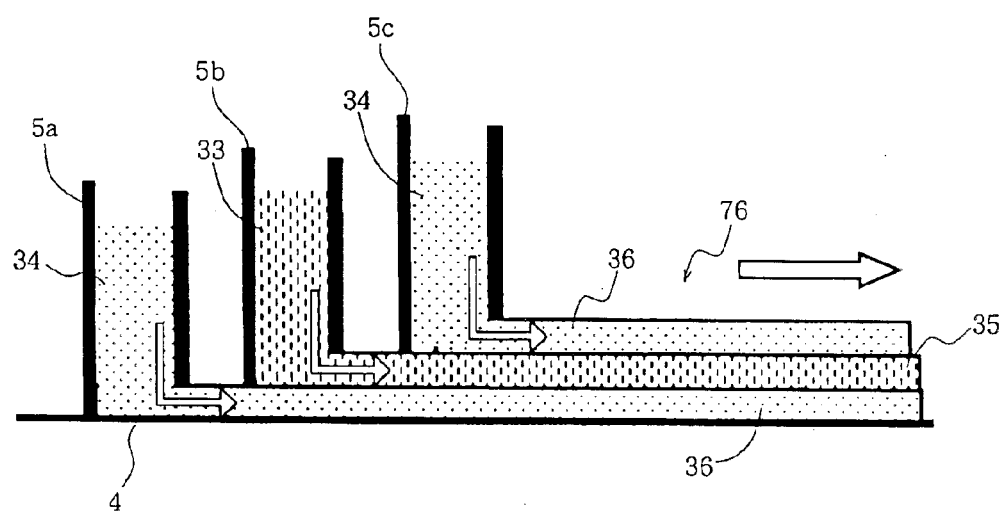
FIG. 15 is a diagram for illustrating another process for preparing the composite ceramic layer.
Figure 16:
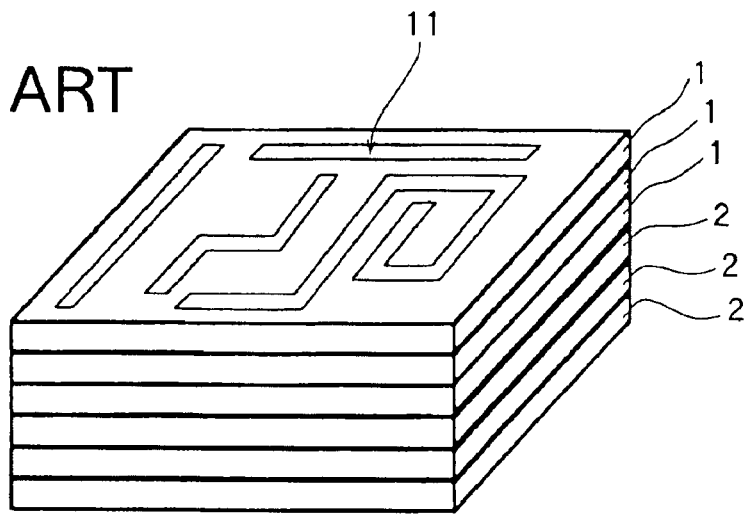
FIG. 16 is a perspective view of a conventional composite device of the laminate type.
Figure 17:
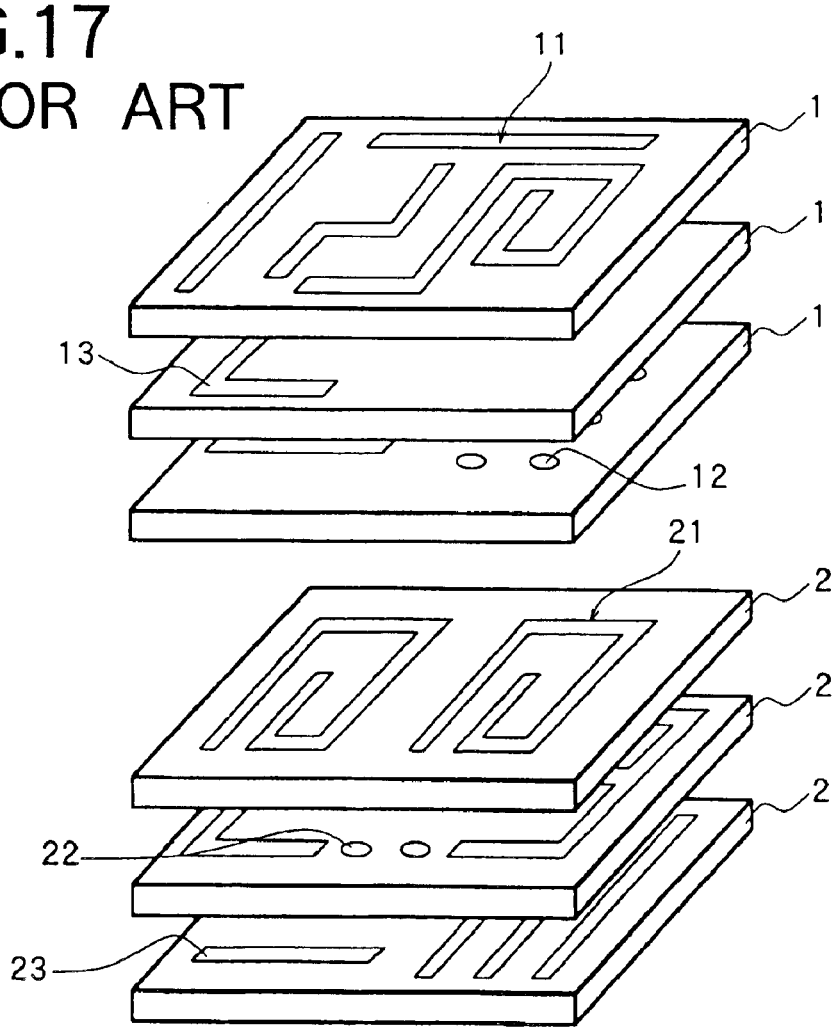
FIG. 17 is an exploded perspective view of the device.
Figure 18:
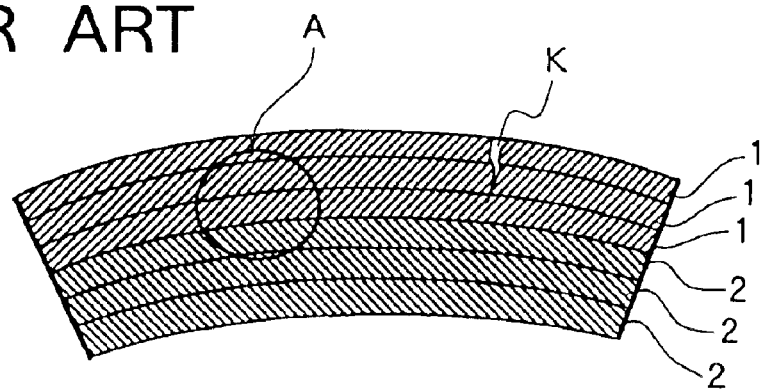
FIG. 18 is a diagram for illustrating a problem encountered with the device.
Figure 19:
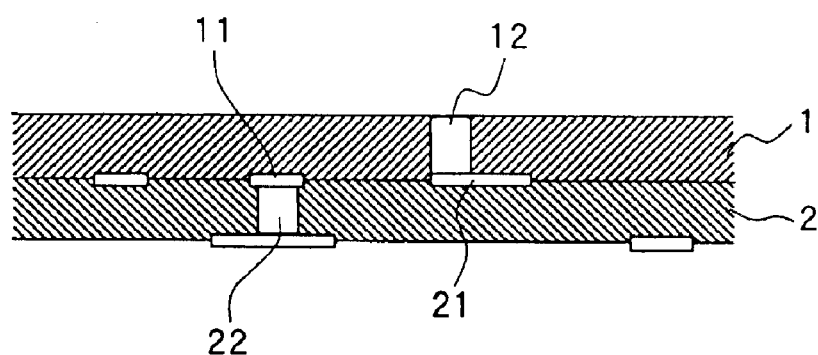
FIG. 19($a$) is an enlarged view of the portion A in FIG. 18 before firing.
Figure 19:
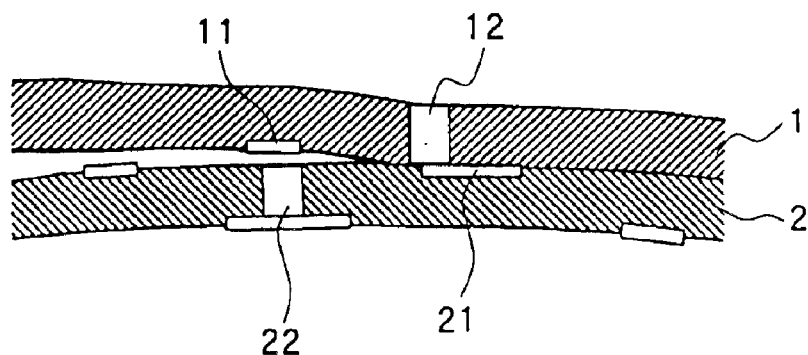

FIG. 15 shows another process for preparing the composite green sheet 76. With reference to FIG. 15, first to third three casting heads 5*a*, 5*b*, 5*c* are arranged above a carrier film 4. A magnetic body slurry 33 is fed to the inside of the second casting head 5*b* positioned in the middle, and a dielectric slurry 34 is supplied to the inside of the first and third casting heads 5*a*, 5*c* arranged in front of and in the rear of the head 5*b*.

The carrier film 4 is transported at a predetermined speed, whereby the dielectric slurry delivered from the first casting head 5*a* is applied onto the film 4 to a predetermined thickness, and the magnetic body slurry 33 discharged from the second casting head 5*b* is applied onto the surface of the coating to a predetermined thickness. The dielectric slurry 34 discharged from the third casting head 5*c* is further applied onto the surface of the resulting coating to a predetermined thickness.

Consequently, the layers of the slurries 34, 33, 34 are superposed, affording a composite green sheet 76 of three-layer structure. The green sheets 36, 35, 36 are superposed each in the form of a slurry in the composite sheet 76 thus obtained, so that at each of the joint interfaces, magnetic body particles in the magnetic body green sheet 35 diffuse into the dielectric green sheet 36, while dielectric particles in the dielectric green sheet 36 diffuse into the green sheet 35. The integral composite green sheet 76 obtained continuously varies in composition in the direction of thickness thereof. If the composite green sheet 76 on the carrier film 4 is heated, the above-mentioned diffusion can be promoted, consequently shortening the time required for diffusion.

Next, a plurality of circuit element patterns are printed with silver on the surface of each of a required number of composite green sheets and a required number of dielectric green sheets to obtain composite ceramic boards and dielectric boards. These boards are arranged in superposed layers to obtain a laminate.

The laminate is thereafter fired at a high temperature of 800° C. to 1000° C. to prepare an integral sintered laminate. Finally a plurality of electronic components are mounted on the surface of the sintered laminate as required to complete a composite device of the laminate type in the form of a single chip.

With the composite device of the laminate type embodying the present invention, the composite ceramic layer 7 comprises an intermediate layer 70 of magnetic body ceramic material, and two surface layers 71, 71 having the same composition as the dielectric ceramic layer 2 as shown in FIG. 11, so that the shrinkage of the entire composite ceramic layer 7 as fired is intermediate between the shrinkage of the intermediate layer 70 made from the magnetic body ceramic material and the shrinkage of the surface layers 71, 71 having the same composition as the dielectric ceramic layer 2. Consequently the difference of the composite ceramic layer 7 from the dielectric ceramic layer 2 in shrinkage is smaller than the difference of the conventional magnetic body ceramic layer, which is made from the magnetic body ceramic material in its entirety, from the dielectric ceramic layer 2 in shrinkage. Further the joint between the composite ceramic layer 7 of the invention and the dielectric ceramic layer 2 involves no difference in shrinkage since layers made from the dielectric ceramic material and having the same composition are joined to each other at this joint.

Accordingly, when the laminate structure of the composite ceramic layer 7 and the dielectric ceramic layer 2 is formed by the firing step in fabricating the composite device of the laminate type embodying the invention, it is unlikely that a great difference will occur between the composite ceramic layer 7 and the dielectric ceramic layer 2 in shrinkage, consequently making the deflection of the ceramic layer 7 or 2 smaller than in the prior art and inhibiting the layer 7 or 2 from cracking or separating. This results in a higher yield than conventionally.

A major portion of the composite ceramic layer 7 other than the surfaces layers 71 on opposite sides is made from the magnetic body ceramic material, so that the layer 7 retains the function of a magnetic body, affording a great inductance when provided with L-patterns on its surface. The composite device of the laminate type is therefore unlikely to become large-sized owing to an increase in the number of laminated layers.

Furthermore, the composite ceramic layer 7 can be prepared from a single magnetic body green sheet for making the intermediate layer 70 and two dielectric green sheets for making the surface layers 71, 71, such that dielectric green sheets for making dielectric ceramic layers 2 are serviceable also as such dielectric green sheets. Accordingly, the green sheets to be prepared for use in fabricating the composite device of the laminate type of the invention are limited to two kinds, i.e., magnetic body green sheets and dielectric green sheets.

The process for preparing the composite ceramic layer 7 is not limited to those described above. Also usable is a process for forming a thin film which varies in composition in the direction of thickness thereof by resorting to sputtering, vacuum evaporation, plating or the like. Furthermore, the low-temperature firing step in the process for preparing the composite ceramic layer can be dispensed with. In this case, the composite ceramic layer is formed by the high-temperature firing step.

The device and process of the present invention are not limited to the foregoing embodiments in construction but can be modified variously by one skilled in the art without departing from the spirit of the invention as set forth in the appended claims. For example, the process for preparing the magnetic body ceramic layer or the dielectric ceramic layer is not limited to those described for the foregoing embodiments. Such layers can be prepared, for example, by sputtering, vacuum evaporation or plating.

What is claimed is:

1. A composite device having a laminate structure of a first ceramic layer and a second ceramic layer different from each other in composition, each of the ceramic layers having one or a plurality of circuit element patterns formed on a surface thereof to provide an electronic circuit for performing a predetermined function, an intermediate layer being interposed between the first ceramic layer and the second ceramic layer, the intermediate layer varying in composition in the direction of thickness thereof and exhibiting substantially the same shrinkage as the first ceramic layer at a joint thereof with the first ceramic layer when fired and substantially the same shrinkage as the second ceramic layer at a joint thereof with the second ceramic layer when fired.

2. A composite device according to claim 1 wherein the intermediate layer contains at least one of elements constituting the first ceramic layer and at least one of elements constituting the second ceramic layer, the intermediate layer containing a greater amount of said one element of the first ceramic layer than said one element of the second ceramic layer in the vicinity of the joint thereof with the first ceramic layer and a greater amount of said one element of the second ceramic layer than said one element of the first ceramic layer in the vicinity of the joint thereof with the second ceramic layer.

3. A composite device according to claim 1 wherein the intermediate layer has the same composition as the first ceramic layer in the vicinity of the joint thereof with the first ceramic layer and the same composition as the second ceramic layer in the vicinity of the joint thereof with the second ceramic layer.

4. A composite device according to claim 1 wherein the intermediate layer is made from a material having a specific resistance of at least $10^4$ Ω-cm.

5. A composite device according to claim 1 wherein the first ceramic layer is a magnetic body, and the second ceramic layer is a dielectric.

6. A composite device having a laminate structure of a first ceramic layer and a second ceramic layer different from each other in composition, each of the ceramic layers having one or a plurality of circuit element patterns formed on a surface thereof to provide an electronic circuit for performing a predetermined function, wherein the first ceramic layer and the second ceramic layer are in contact with each other at a joint, and wherein at least the first ceramic layer varies in composition in the direction of thickness thereof and exhibits substantially the same shrinkage as the other ceramic layer at the joint thereof when fired.

7. A composite device according to claim 6 wherein at least one of said ceramic layers contains at least one of elements constituting the other ceramic layer and increases in the content of said one element toward the joint thereof with the other ceramic layer.

8. A composite device according to claim 6 wherein each ceramic layer has the same composition as the other ceramic layer in the vicinity of the joint thereof with the other ceramic layer.

9. A composite device according to claim 6 wherein the first ceramic layer is a magnetic body, and the second ceramic layer is a dielectric.

10. A composite device according to claim 6 wherein each of the first ceramic layer and the second ceramic layer as arranged in contact with each other varies in composition in the direction of thickness thereof, and the two ceramic layers exhibit substantially the same shrinkage in the vicinity of the joint thereof when fired.

11. A composite device having a laminate structure of a first ceramic layer and a second ceramic layer different from each other in composition, each of the ceramic layers having one or a plurality of circuit element patterns formed on a surface thereof to provide an electronic circuit for performing a predetermined function,
the first ceramic layer having
a three-layer structure comprising an intermediate layer, and
a pair of surface layers that are arranged on opposite sides of the intermediate layer and that have the same composition as the second ceramic layer.

12. A composite device according to claim 11 wherein the intermediate layer of the first ceramic layer is a magnetic body, and the second ceramic layer is a dielectric.

13. A composite device according to claim 11 wherein the intermediate layer of the first ceramic layer is a dielectric, and the second ceramic layer is a magnetic body.

* * * * *